(12) United States Patent
Lim

(10) Patent No.: US 11,208,119 B2
(45) Date of Patent: Dec. 28, 2021

(54) GUIDE MODULE AND DRIVING DEVICE HAVING THE SAME

(71) Applicant: SEJIN-IGB CO., LTD., Asan-si (KR)

(72) Inventor: Sun Ho Lim, Asan-si (KR)

(73) Assignee: SEJIN-IGB CO., LTD., Asan-si (KR)

( * ) Notice: Subject to any disclaimer, the term of this patent is extended or adjusted under 35 U.S.C. 154(b) by 266 days.

(21) Appl. No.: 16/324,683

(22) PCT Filed: Jan. 23, 2018

(86) PCT No.: PCT/KR2018/000971
§ 371 (c)(1),
(2) Date: Feb. 11, 2019

(87) PCT Pub. No.: WO2018/169199
PCT Pub. Date: Sep. 20, 2018

(65) Prior Publication Data
US 2021/0276600 A1 Sep. 9, 2021

(51) Int. Cl.
*B61B 13/02* (2006.01)
*B60L 13/00* (2006.01)
*B61B 13/12* (2006.01)
*H01L 21/677* (2006.01)

(52) U.S. Cl.
CPC .............. *B61B 13/02* (2013.01); *B60L 13/00* (2013.01); *B61B 13/127* (2013.01); *H01L 21/67706* (2013.01)

(58) Field of Classification Search
CPC ....... B61B 13/02; B61B 13/127; B60L 13/00; H01L 21/67706; F16H 19/04; F16H 55/08; F16H 55/10; F16H 55/26
USPC ................................................. 105/29.1, 127
See application file for complete search history.

(56) References Cited

U.S. PATENT DOCUMENTS

| | | | | |
|---|---|---|---|---|
| 5,735,214 A | * | 4/1998 | Tsuboi | F16C 29/005 104/106 |
| 6,098,550 A | * | 8/2000 | Tsuboi | B61B 13/06 105/127 |
| 6,220,174 B1 | * | 4/2001 | Gudel | B61B 13/02 105/29.1 |

(Continued)

FOREIGN PATENT DOCUMENTS

| | | |
|---|---|---|
| EP | 2634456 A1 | 9/2013 |
| JP | H11129896 A | 5/1999 |

(Continued)

OTHER PUBLICATIONS

Office Action dated Mar. 3, 2020 from Japanese Patent Application No. 2018-568722 to Sejin-igb Co., Ltd.

(Continued)

*Primary Examiner* — Zachary L Kuhfuss
(74) *Attorney, Agent, or Firm* — Vorys, Sater, Seymour and Pease LLP

(57) ABSTRACT

Disclosed is a guide module and a driving device having the guide module. The driving device includes a moving unit mounted on a pinion interacting with a rack and moving with the pinion along a trajectory of the rack, and a guide module arranged at at least any one side of the rack, connected to the moving unit, and guiding a movement of the moving unit that moves with the pinion along the trajectory of the rack.

20 Claims, 21 Drawing Sheets

(56) References Cited

U.S. PATENT DOCUMENTS

| | | | |
|---|---|---|---|
| 2007/0251408 A1* | 11/2007 | Fletcher | B61B 13/02 104/247 |
| 2009/0293758 A1 | 12/2009 | Timan | |
| 2012/0090415 A1* | 4/2012 | Lim | F16H 19/04 74/89.17 |
| 2012/0174690 A1* | 7/2012 | Lim | F16H 57/043 74/29 |
| 2013/0186213 A1* | 7/2013 | Lim | F16H 19/04 74/31 |
| 2013/0192487 A1 | 8/2013 | Fanshawe et al. | |
| 2014/0026692 A1* | 1/2014 | Lim | F16H 55/10 74/29 |
| 2018/0066743 A1 | 3/2018 | Lim | |

FOREIGN PATENT DOCUMENTS

| | | |
|---|---|---|
| JP | H11208859 A | 8/1999 |
| JP | 2010162199 A | 7/2010 |
| JP | 5569371 B2 | 8/2014 |
| KR | 20110030500 A | 3/2011 |
| KR | 101389360 B1 | 4/2014 |
| KR | 101532641 B1 | 7/2015 |
| KR | 20160109548 A | 9/2016 |
| WO | 2016144015 A1 | 9/2016 |

OTHER PUBLICATIONS

Extended European Search Report dated Feb. 20, 2020 from European Patent Application No. 18767423.9 to Sejin-igb Co., Ltd.

International Search Report and Written Opinion dated Jun. 28, 2018 for PCT/KR2018/000971 to Sejin-Igb Co., Ltd. filed Jan. 23, 2018.

* cited by examiner

GUIDE MODULE AND DRIVING DEVICE HAVING THE SAME

CROSS-REFERENCE TO RELATED APPLICATIONS

This is a § 371 National Stage Application of International Application No. PCT/KR2018/000971 filed on Jan. 23, 2018, claiming the priority of Korean Patent Application No. 10-2017-0031572 filed on Mar. 14, 2017.

TECHNICAL FIELD

The present inventive concept relates to a guide module and a driving device having the guide module, and more particularly, to a guide module which may have a stable movement of a moving unit by guiding a movement of the moving unit when the moving unit mounted on a pinion moves along a trajectory of a rack, and a driving device having the guide module.

BACKGROUND ART

Driving devices may be applied to various industrial equipment including semiconductor equipment or flat panel display equipment such as LCDs, PDPs, or OLEDs, to implement a linear or curved motion.

A moving unit that is a target moving body forming a driving device may perform a linear or curved motion according to interaction between a rack and pinion. For example, when the rack is a linear type, the moving unit may perform a linear motion by the interaction with the pinion, and when the rack is a curved type, the moving unit may perform a curved motion by the interaction with the pinion.

Accordingly, based on the above structures and functions, the linear or curved movement of the moving unit may be implemented by appropriately combining the rack and pinion and the moving unit. The above structure may be used suitable for various industrial equipment and for a corresponding process. For example, the structure may be used for a transfer process of carrying an object placed on the moving unit.

In a combination of a rack and pinion, when the pinion solely performs a linear motion or a curved motion along a trajectory of the rack, since the weight of the pinion is not great, there may be no special hindrance in the driving of the pinion.

However, when the moving unit that is a heavy weight body is mounted on the pinion, an object is placed on the moving unit, and then the moving unit is moved or operated by the operation of a rack and pinion, as described above, a device for guiding the movement of the moving unit is needed. When the movement of the moving unit is not guided, it is difficult to obtain a stable operation of the moving unit. In particular, when the moving unit that is a heavy weight body or the object placed on the moving unit is moved, large load is applied to the rack or pinion and thus durability of the device may deteriorate.

However, considering that a device for guiding the movement of the moving unit mounted on the pinion has not been employed in a conventional art for implementing a driving device with the interaction between the rack and the pinion, development of such a technology is needed.

DETAILED DESCRIPTION OF THE INVENTIVE CONCEPT

Technical Problem

The present inventive concept provides a guide module and a driving device having the guide module, in which the guide module may have a stable movement of a moving unit by guiding the movement of the moving unit when the moving unit mounted on a pinion moves along a trajectory of a rack, and also may prevent deterioration of durability due to an overload applied to the device.

Advantageous Effects

According to the present inventive concept, when the moving unit mounted on the pinion moves along the trajectory of the rack, the movement of the moving unit may be guided and thus a stable operation of the moving unit may be obtained. Furthermore, the deterioration of durability due to an overload applied to the device may be prevented.

BEST MODE

Figure 1:
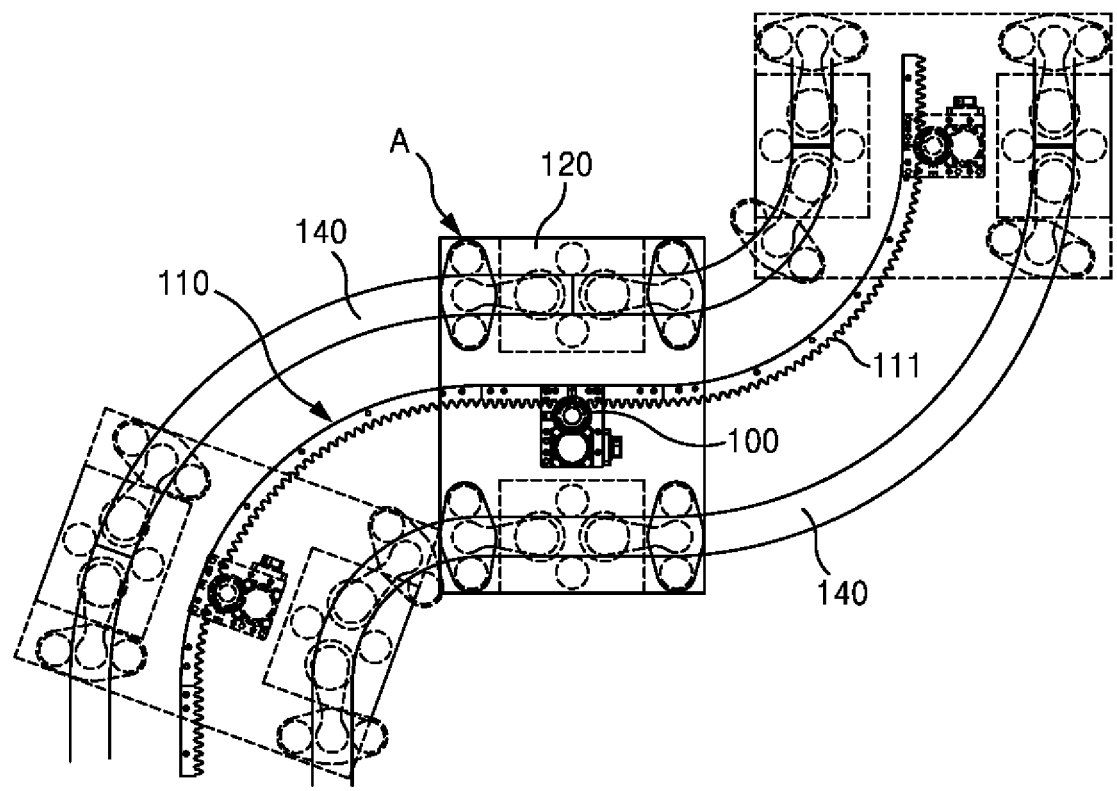
FIG. 1 is a plan view of a structure of a driving device according to an embodiment of the present inventive concept.

According to an aspect of the present inventive concept, a driving device includes a moving unit mounted on a pinion interacting with a rack and moving with the pinion along a trajectory of the rack, and a guide module arranged at at least any one side of the rack, connected to the moving unit, and guiding a movement of the moving unit that moves with the pinion along the trajectory of the rack.

The guide module may include a module rail forming the same trajectory as the rack at one side of the rack, and a running portion including a plurality of running wheels guided to run on a side wall of the module rail, and a running wheel connection block arranged across the module rail and connected to the plurality of running wheels.

The guide module may further include a front steering portion connected to the running portion in front of the running portion, and the front steering portion includes a plurality of front steering wheels steered and guided to run on the side wall of the module rail when passing a curved section of the module rail, and a front steering wheel connection block arranged across the module rail and connected to the plurality of front steering wheels.

The guide module may further include a rear steering portion symmetrically arranged to the front steering portion and connected to the running portion at the back of the running portion, and the rear steering portion includes a plurality of rear steering wheels steered and guided to run on the side wall of the module rail when passing the curved section of the module rail, and a rear steering wheel connection block arranged across the module rail and connected to the plurality of rear steering wheels.

The guide module may further include a front relative rotation connection portion connecting the running portion with the front steering portion to rotate relative to each other, and a rear relative rotation connection portion connecting the running portion with the rear steering portion to rotate relative to each other.

The front relative rotation connection portion may include a front link member having one end portion arranged on the module rail between the plurality of front steering wheels and the other end portion placed in a first side recess portion of the running wheel connection block, a first steering bearing integrally coupled to the front steering wheel connection block and the front link member in an area of one end portion of the front link member, and a second steering bearing coupled to the other end portion of the front link member.

The rear relative rotation connection portion may include a rear link member having one end portion arranged on the module rail between the plurality of rear steering wheels and the other end portion placed in a second side recess portion of the running wheel connection block, a third steering bearing integrally coupled to the rear steering wheel connection block and the rear link member in an area of one end portion of the rear link member, and a fourth steering bearing coupled to the other end portion of the rear link member.

The guide module may further include a supporting block supporting the moving unit, the supporting block being coupled to the moving unit and the running wheel connection block between the moving unit and the running wheel connection block.

A plurality of bearing holes where the second steering bearing and the fourth steering bearing are respectively seated may be formed in the supporting block.

The guide module may further include a plurality of dowel pins, each having one end portion coupled to the supporting block across a lengthwise direction of the module rail and the other end portion connected to the moving unit by passing through the supporting block.

The pinion may be arranged on a virtual connection line connecting the plurality of dowel pins.

The rack may include a linear type rack allowing the pinion to perform a linear motion, a curved type rack allowing the pinion to perform a curved motion by interaction with the pinion, and a linear/curve converting rack connected to the linear type rack and the curved type rack between the linear type rack and the curved type rack, and converting the linear motion and the curved motion of the pinion.

The linear/curve converting rack may include a linear portion having a linear type tooth connected to the linear type rack, and a linear/curved converting portion having a linear/curve converting tooth, wherein one side of the linear/curve converting tooth is connected to the linear portion and the other side of the linear/curve converting tooth is connected to the curved type rack.

The linear portion and the linear/curved converting portion may be integrally formed, the linear type tooth may include a plurality of linear type teeth on the linear portion, and the linear/curve converting tooth may include one or two linear/curve converting teeth on the linear/curved converting portion.

Tooth profiles of both sides surfaces of the linear/curve converting tooth may be asymmetrical with respect to a center line, a curvature of a first tooth profile of one side surface of the linear/curve converting tooth may match tooth profile curvatures of teeth formed on the curved type rack, and a curvature of a second tooth profile of the other side surface of the linear/curve converting tooth may match tooth profile curvatures of teeth formed on the linear type rack.

The pinion may have an arrangement structure of a circular shape and include a plurality of power transfer pins rotating mutually corresponding to a tooth profile of the rack, and a pinion driving portion that drives the pinion for rotation of the pinion is connected to the pinion.

According to another aspect of the present inventive concept, a guide module which is arranged at at least any one side of a rack that interacts with a pinion, connected to a moving unit that moves with the pinion along a trajectory of the rack, and guides a movement of the moving unit, includes a module rail forming the same trajectory as the rack on one side of the rack, and a running portion including a plurality of running wheels guided to run on a side wall of the module rail, and a running wheel connection block arranged across the module rail and connected to the plurality of running wheels.

The guide module may further include a front steering portion connected to the running portion in front of the running portion, wherein the front steering portion includes a plurality of front steering wheels steered and guided to run on the side wall of the module rail when passing a curved section of the module rail, and a front steering wheel connection block arranged across the module rail and connected to the plurality of front steering wheels.

The guide module may further include a rear steering portion arranged symmetrically to the front steering portion and connected to the running portion at the back of the running portion, wherein the rear steering portion includes a plurality of rear steering wheels steered and guided to run on the side wall of the module rail when passing a curved section of the module rail, and a rear steering wheel connection block arranged across the module rail and connected to the plurality of rear steering wheels.

The guide module may further include a front relative rotation connection portion connecting the running portion with the front steering portion to rotate relative to each other, and a rear relative rotation connection portion connecting the running portion with the rear steering portion to rotate relative to each other.

The front relative rotation connection portion may include a front link member having one end portion arranged on the module rail between the plurality of front steering wheels and the other end portion placed in a first side recess portion of the running wheel connection block, a first steering bearing integrally coupled to the front steering wheel connection block and the front link member in an area of one end portion of the front link member, and a second steering bearing coupled to the other end portion of the front link member.

The rear relative rotation connection portion may include a rear link member having one end portion arranged on the module rail between the plurality of rear steering wheels and the other end portion placed in a second side recess portion of the running wheel connection block, a third steering bearing integrally coupled to the rear steering wheel connection block and the rear link member in an area of one end portion of the rear link member, and a fourth steering bearing coupled to the other end portion of the rear link member.

The guide module may further include a supporting block supporting the moving unit, the supporting block being coupled to the moving unit and the running wheel connection block between the moving unit and the running wheel connection block, wherein a plurality of bearing holes where the second steering bearing and the fourth steering bearing are respectively seated are formed in the supporting block.

The guide module may further include a plurality of dowel pins, each having one end portion coupled to the supporting block across a lengthwise direction of the module rail and the other end portion connected to the moving unit by passing through the supporting block.

The pinion may be arranged on a virtual connection line connecting the plurality of dowel pins.

Mode of the Inventive Concept

The attached drawings for illustrating preferred embodiments of the present inventive concept are referred to in order to gain a sufficient understanding of the present inventive concept, the merits thereof, and the objectives accomplished by the implementation of the present inventive concept.

Hereinafter, the present inventive concept will be described in detail by explaining preferred embodiments of the inventive concept with reference to the attached drawings. Like reference numerals in the drawings denote like elements.

Figure 2:
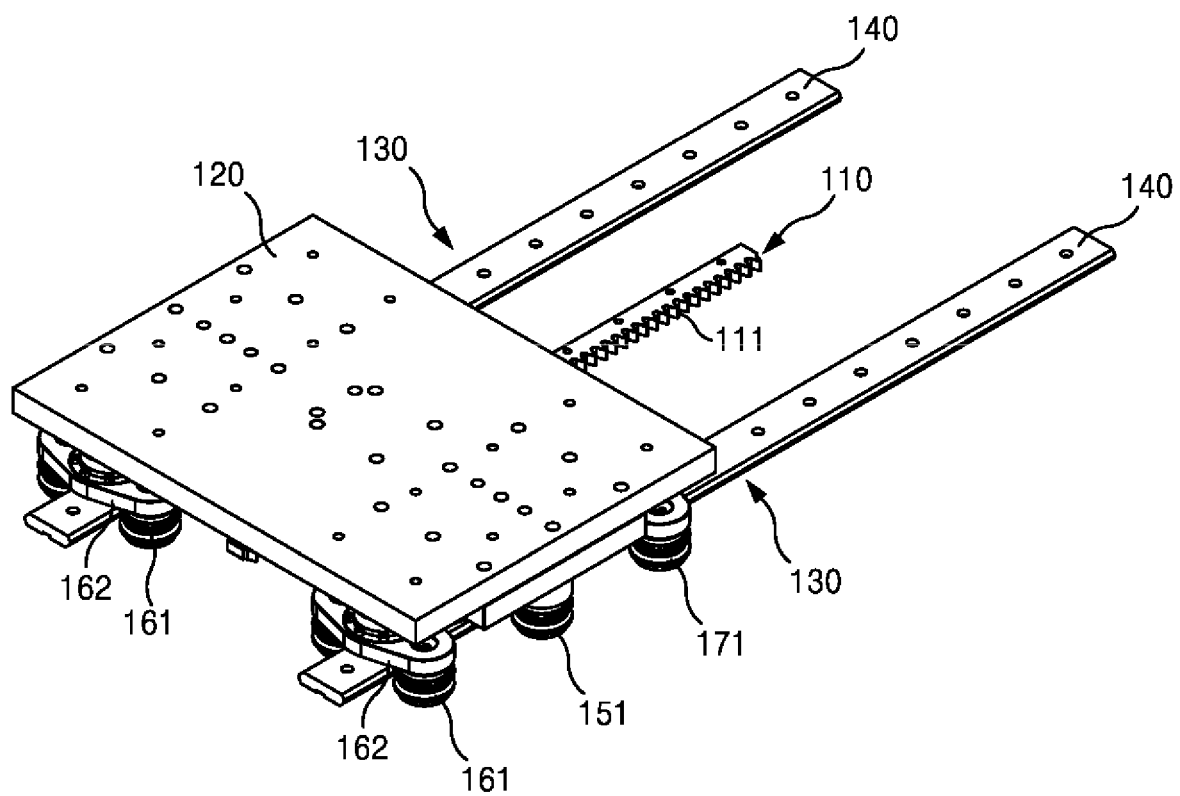
FIG. 2 is a perspective view of the driving device corresponding to an area A of FIG. 1.
Figure 3:
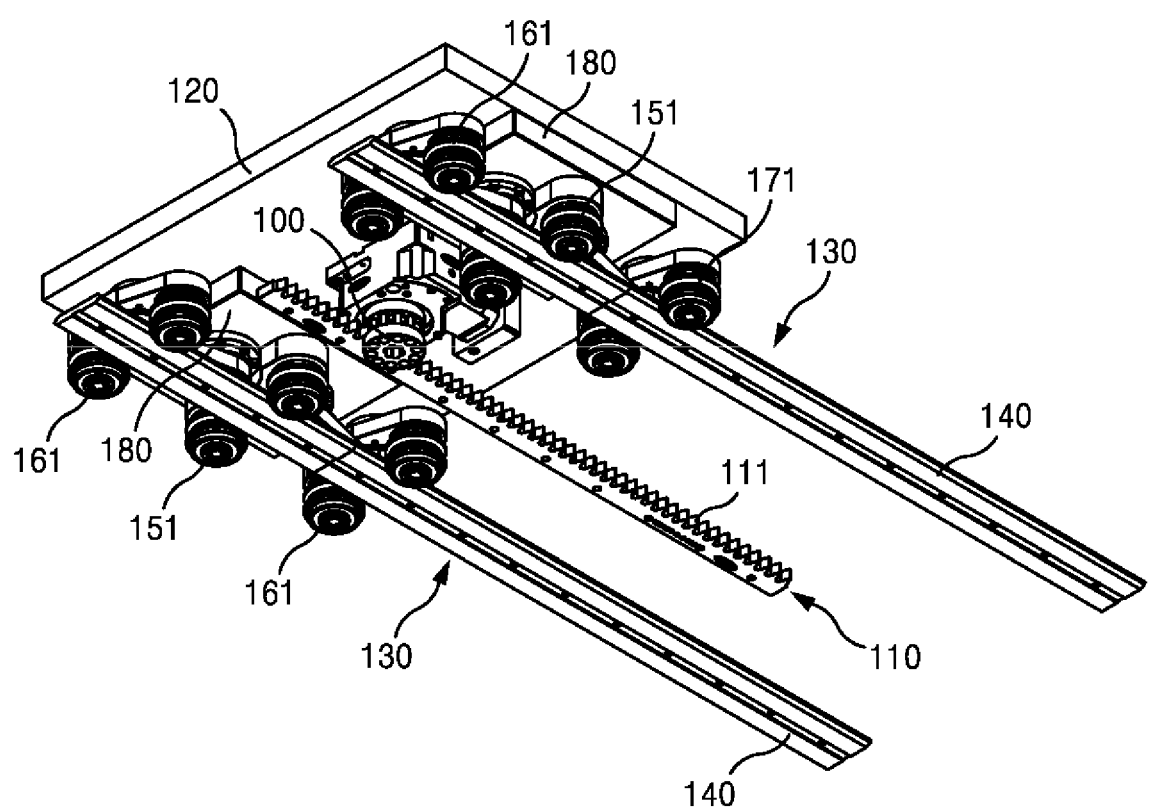
FIG. 3 is a rear perspective view of FIG. 2.
Figure 4:
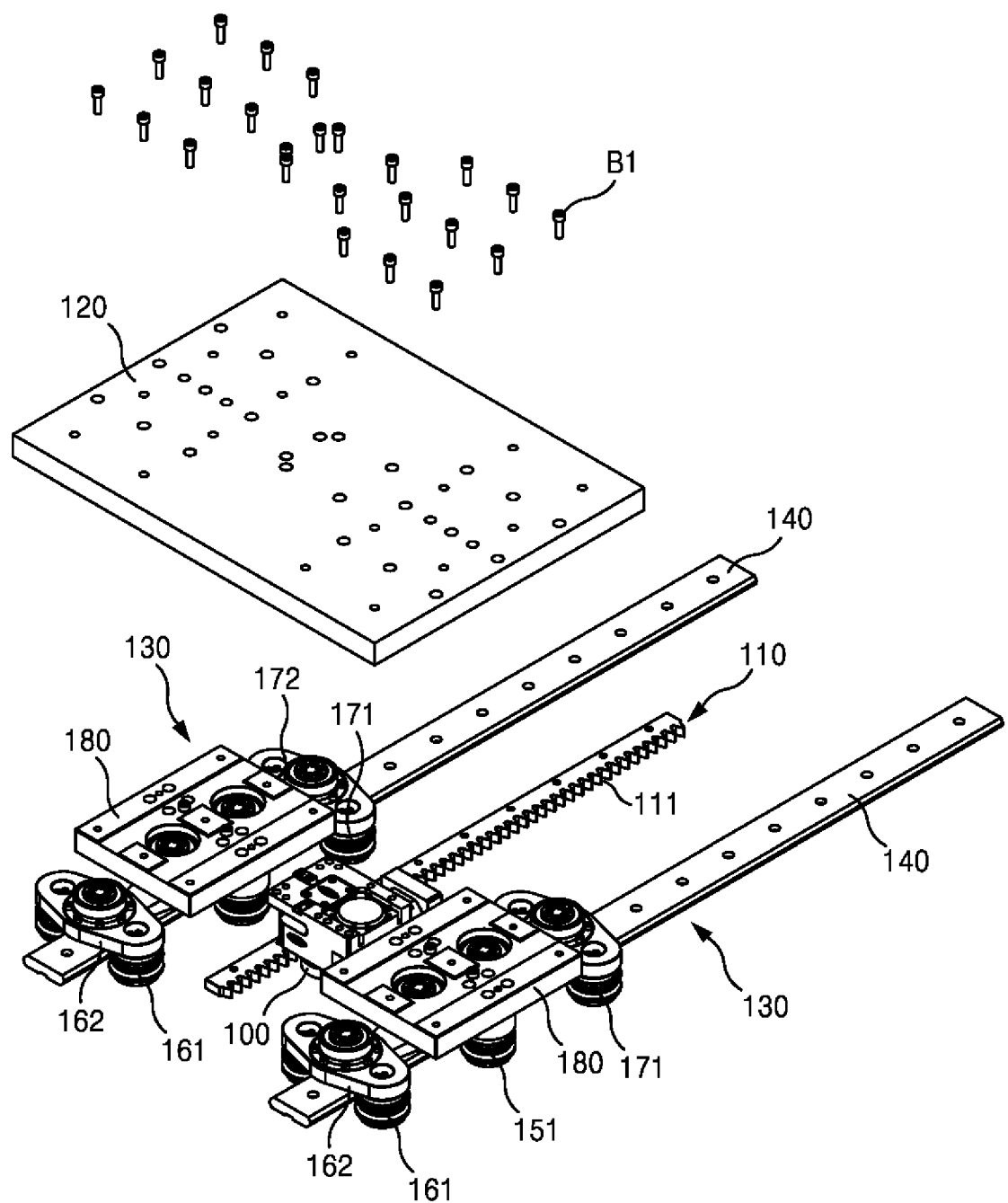
FIG. 4 is an exploded perspective view of FIG. 2, in which a moving unit is separated.
Figure 5:
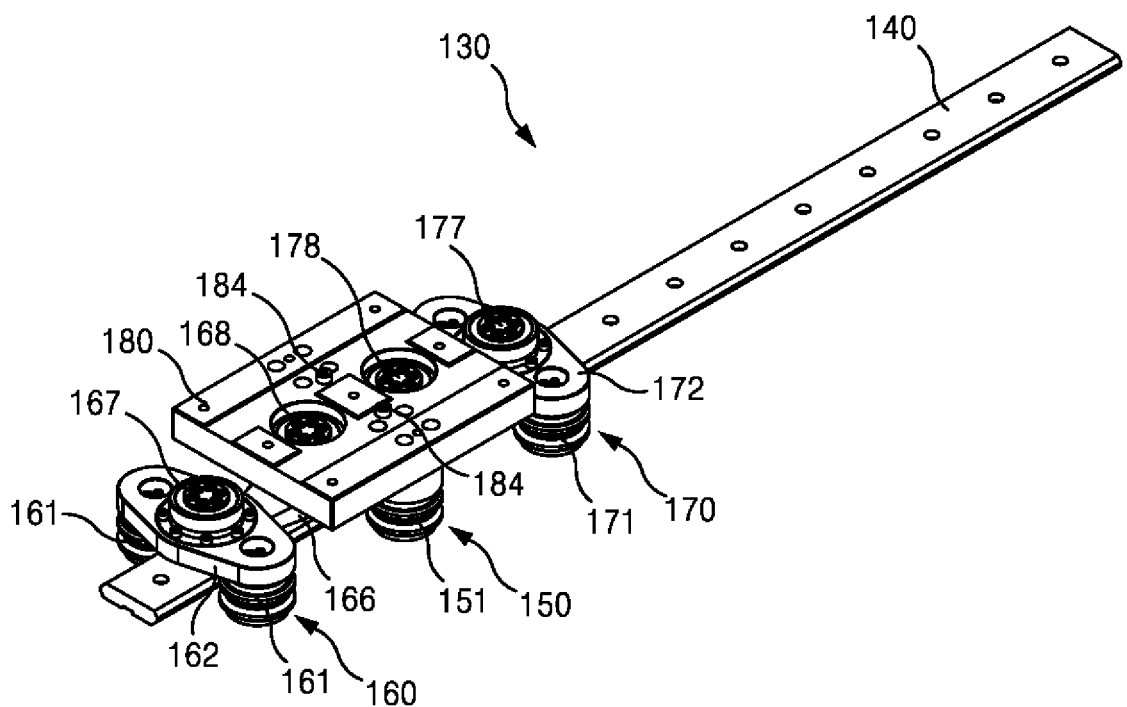
FIG. 5 is an enlarged perspective view of a guide module.
Figure 6:
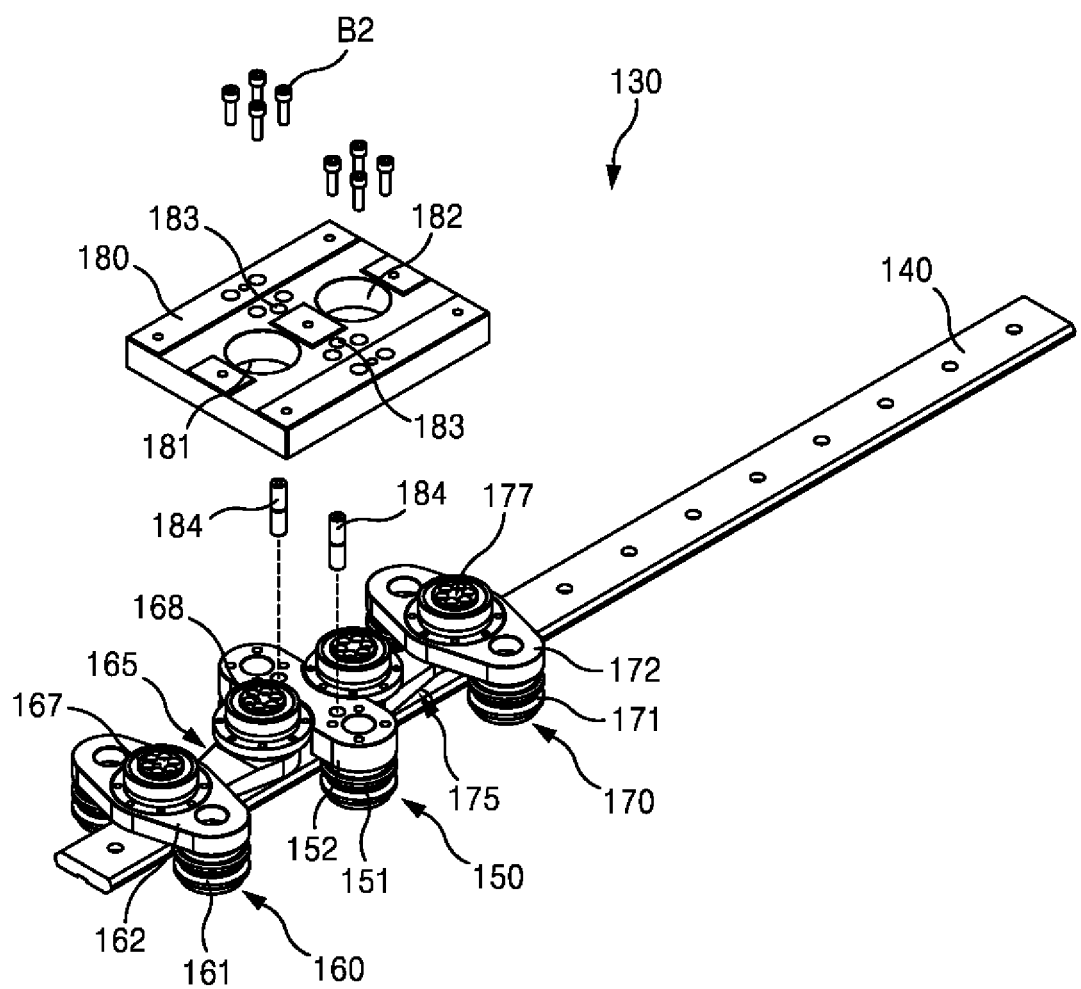
FIG. 6 is a partially exploded perspective view of FIG. 5.
Figure 7:
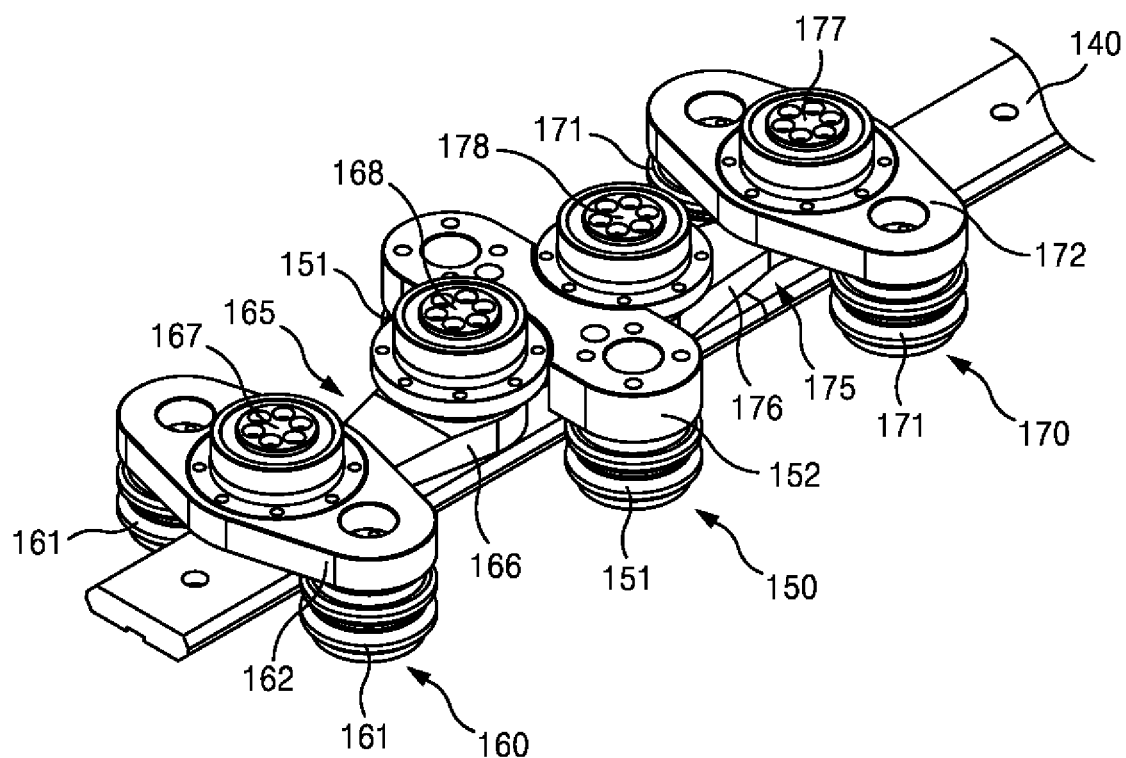
FIG. 7 is an enlarged view of a major portion of FIG. 6.
Figure 8:
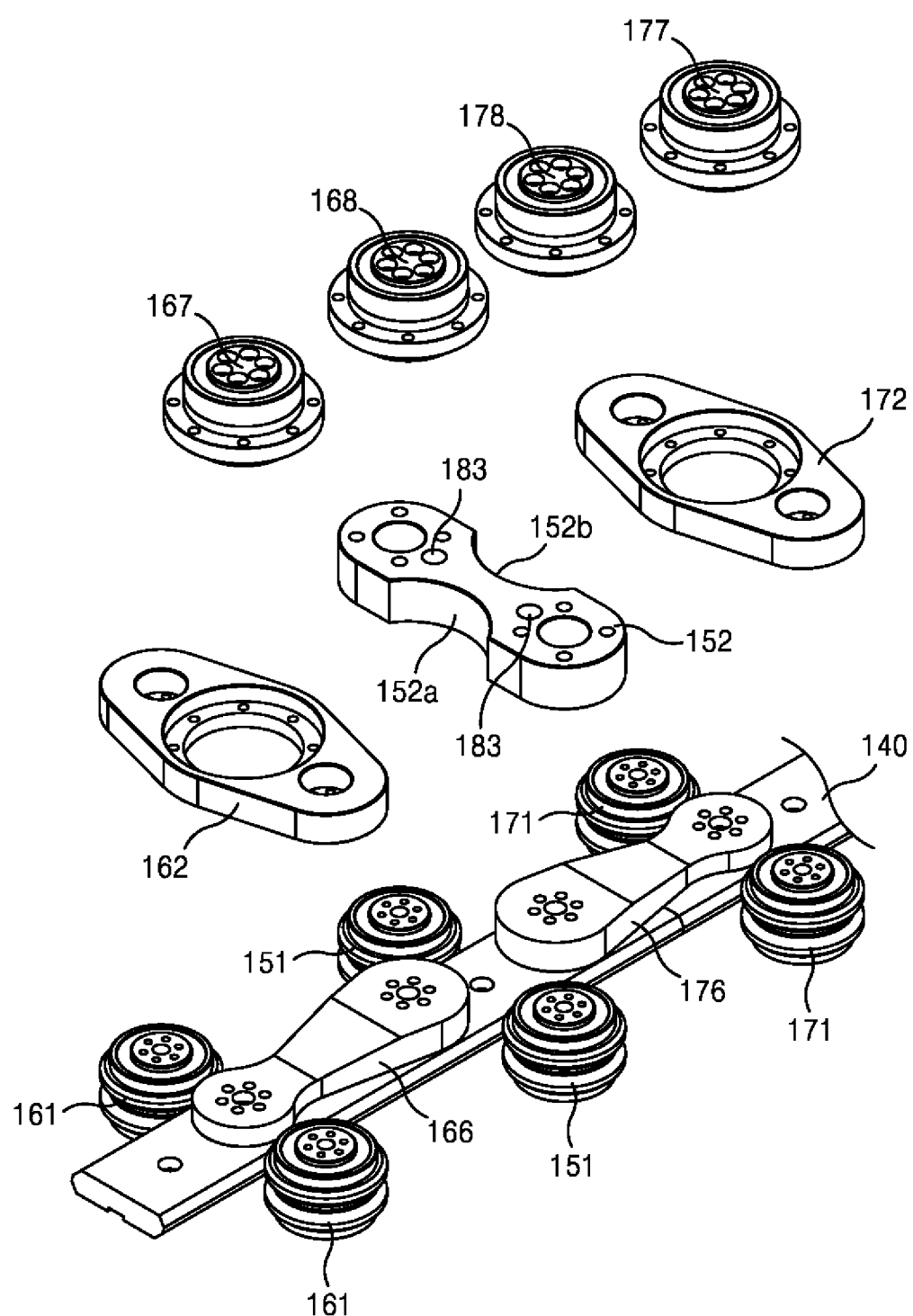
FIG. 8 is an exploded perspective view of FIG. 7.
Figure 9:
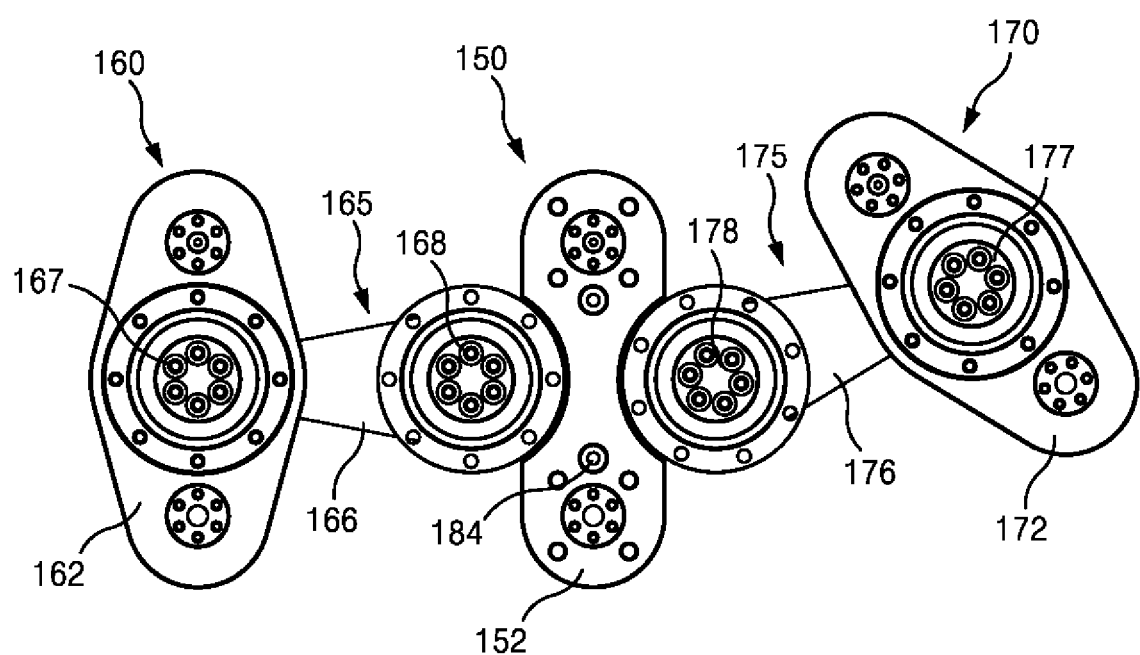
FIG. 9 is a schematic plan view of operations of a running portion, a front steering portion, and a rear steering portion.
Figure 10:
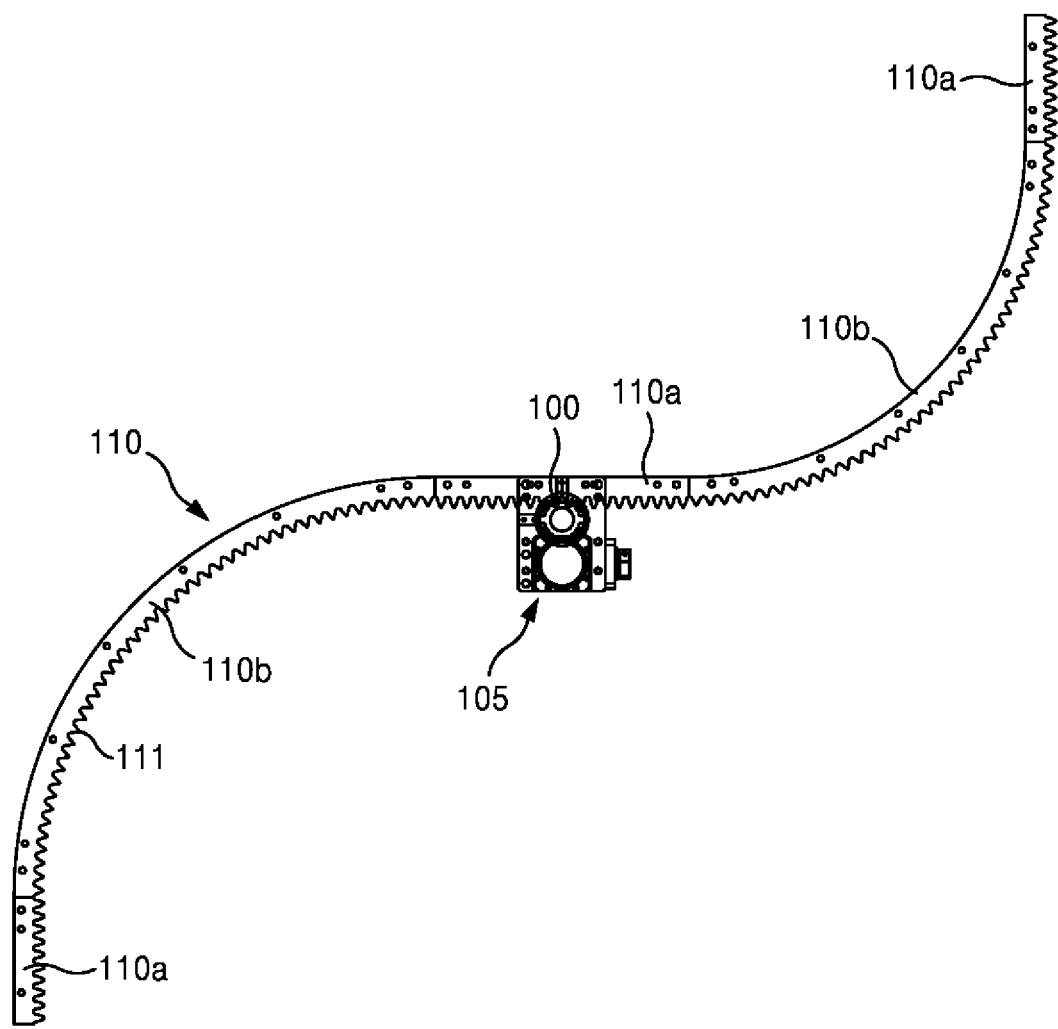
FIG. 10 is an enlarged view of a rack and pinion area shown in FIG. 1.
Figure 11:
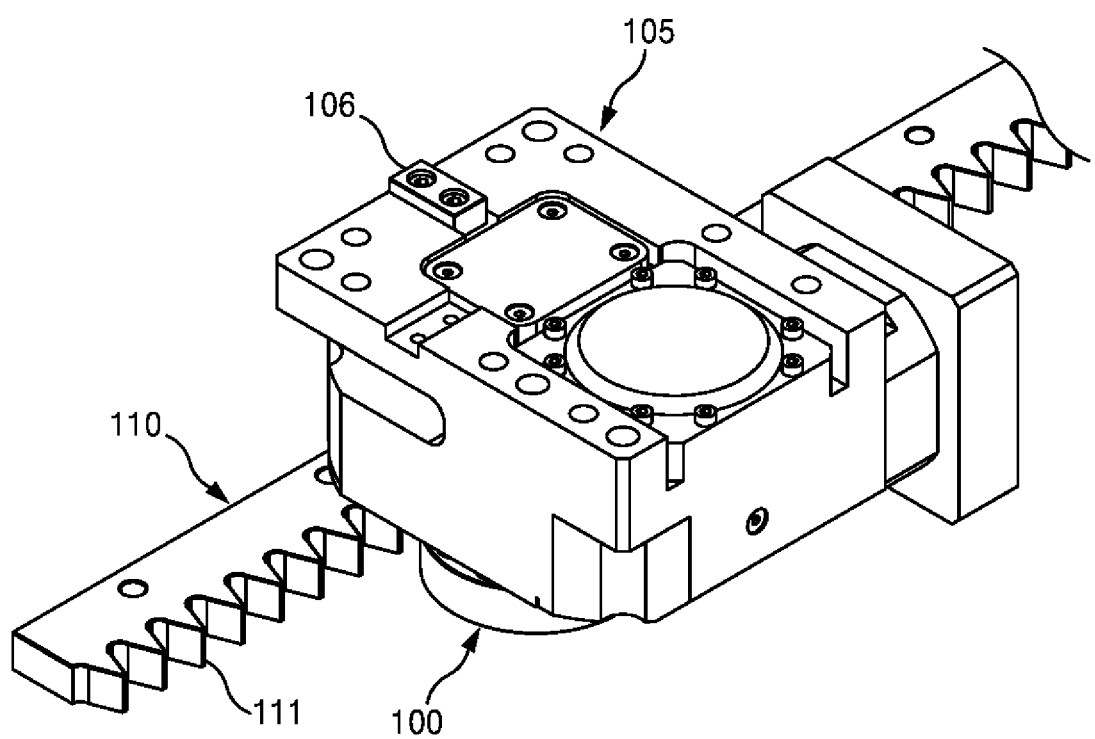
FIG. 11 is an enlarged perspective view of a major portion of FIG. 10.
Figure 12:
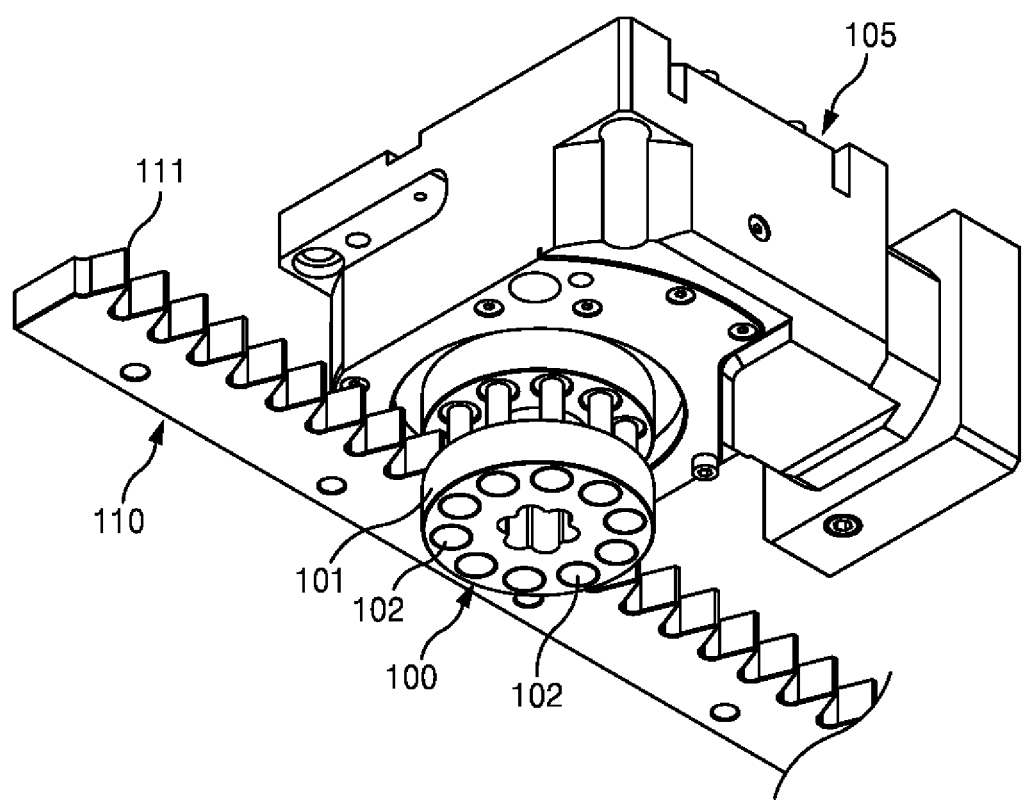
FIG. 12 is a rear perspective view of FIG. 11.
Figure 13:
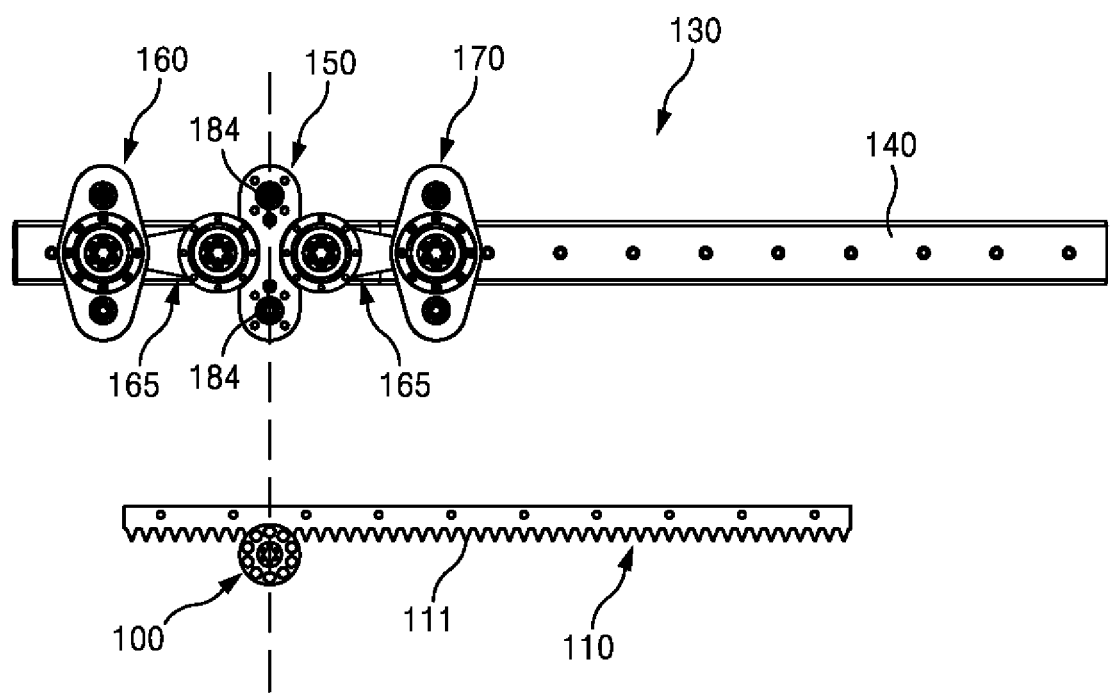
FIG. 13 illustrates an arrangement of a guide module and a pinion.

FIG. 1 is a plan view of a structure of a driving device according to an embodiment of the present inventive concept. FIG. 2 is a perspective view of the driving device corresponding to an area A of FIG. 1. FIG. 3 is a rear perspective view of FIG. 2. FIG. 4 is an exploded perspective view of FIG. 2, in which a moving unit is separated. FIG. 5 is an enlarged perspective view of a guide module. FIG. 6 is a partially exploded perspective view of FIG. 5. FIG. 7 is an enlarged view of a major portion of FIG. 6. FIG. 8 is an exploded perspective view of FIG. 7. FIG. 9 is a schematic plan view of operations of a running portion, a front steering portion, and a rear steering portion. FIG. 10 is an enlarged view of a rack and pinion area shown in FIG. 1. FIG. 11 is an enlarged perspective view of a major portion of FIG. 10. FIG. 12 is a rear perspective view of FIG. 11. FIG. 13 illustrates an arrangement of a guide module and a pinion.

As illustrated in the above drawings, the driving device according to the present embodiment may be applied to various industrial equipment including, for example, semiconductor equipment or flat panel display equipment such as LCDs, PDPs, or OLEDs, to implement a linear or curved motion. A guide module 130 of the driving device according to the present embodiment may guide a movement of the moving unit 120 when a moving unit 120 mounted on a pinion 100 moves along a trajectory of a rack 110. The driving device according to the present embodiment may be applied to industrial sites other than semiconductor equipment or flat panel display equipment.

For example, when a transfer device that is widely applied to an installation process of semiconductor equipment or flat panel display equipment is regarded to be the moving unit 120, the moving unit 120, after being mounted on the pinion 100, moves along the trajectory of the rack 110 according to interaction between the pinion 100 and the rack 110, thereby performing a corresponding process, that is, a transfer process of carrying an object.

In this state, contrary to the conventional art, in the present embodiment, when carrying an object, the moving unit 120 may move by being stably guided. As in the present embodiment, when the moving unit 120 mounted on the pinion 100 moves with the pinion 100 along the trajectory of the rack 110, a stable operation of the moving unit 120 may be available, and also deterioration of durability due to an overload applied to the device may be prevented. Accordingly, application of a substantial apparatus or substantial may be possible.

The driving device according to the present embodiment, which may provide the above effect, may includes the moving unit 120 mounted the pinion 100 interacting with the rack 110 and moving with the pinion 100 along the trajectory of the rack 110, and the guide module 130 arranged at both sides of the rack 110, connected to the moving unit 120, and guiding a movement of the moving unit 120 that moves with the pinion 100 along the trajectory of the rack 110.

The driving device according to the present embodiment may transfer power by the interaction between the rack 110 and the pinion 100. In other words, when a pinion driving portion 105 connected to the pinion 100 is operated to rotate the pinion 100, the pinion 100 may move along the trajectory of the rack 110. Since the moving unit 120 is mounted on the pinion 100, the moving unit 120 may move with the pinion 100 along the trajectory of the rack 110.

As described above, the moving unit 120 may be a carrier that may be applied to an installation process of semiconductor equipment or flat panel display equipment. Accordingly, in the drawing of the present embodiment, the moving unit 120 is illustrated as a plate having a certain thickness to place an object thereon. However, the moving unit 120 is not necessarily a carrier, and considering that, for example, the moving unit 120 may be used as an index, the scope of right of the present inventive concept is not limited thereto.

As illustrated in FIG. 1, when the moving unit 120 has a large area, during a movement of the moving unit 120, the moving unit 120 may be shaken, and thus the movement of the moving unit 120 may be guided at both sides of the moving unit 120. In other words, when the size of the moving unit 120 is large as shown in FIG. 1, the guide module 130 may be provided at both sides, that is, inner and outer sides, of the rack 110 to guide the movement of the moving unit 120. In this case, when the moving unit 120 is moved, a stable operation, for example, not being shaken, may be obtained.

The guide module 130 (see FIGS. 2 and 3) may not be provided, as illustrated in FIG. 1, at both sides, that is, the inner and outer sides, of the rack 110, which is described in the following embodiment with reference to FIGS. 14 to 17.

As described above, the driving device according to the present embodiment may have a structure in which the moving unit 120 is moved by the interaction between the pinion 100 and the rack 110. Accordingly, prior to the description of the guide module 130, the pinion 100 and the rack 110 are first described.

As illustrated in FIG. 1 and FIGS. 10 to 13, the pinion 100 rotates in contact with the rack 110, that is, circumscribing the rack 110, and performs a linear or curved motion along the trajectory of the rack 110. The pinion 100 may inscribe the rack 110, which is described later.

The pinion 100 may include a pinion body 101 having a disc shape and a plurality of power transfer pins 102 coupled to the pinion body 101. The power transfer pins 102 has a arrangement structure of a circular shape in the pinion body 101, and rotate mutually corresponding to the tooth profile of a tooth 111 formed on the rack 110.

The pinion driving portion 105 is connected to the pinion 100 for the rotation of the power transfer pins 102. A motor and gear parts may be used as the pinion driving portion 105 to rotate the pinion 100. When the pinion 100 is rotated by the pinion driving portion 105, the pinion 100 may be moved along the trajectory of the rack 110.

An assembly position guide piece 106 (see FIG. 11) may be coupled to one side of an outer wall of the pinion driving portion 105. The assembly position guide piece 106 may guide an assembly position of the pinion 100. In other words, an operator may be guided to the assembly position of the pinion 100 by seeing the position of the assembly position guide piece 106.

The rack 110 may form a trajectory along which the pinion 100 moves. As illustrated in FIGS. 1 and 10, in the present embodiment, the rack 110 may include a combination of a linear rack portion 110a and a curved rack portion 110b. The linear rack portion 110a only may be used, or the curved rack portion 110b only may be used, according to the equipment. However, in semiconductor equipment, a combination of the linear rack portion 110a and the curved rack portion 110b is frequently used.

The moving unit 120 is a structure that, as described above, is mounted on the pinion 100 and moves with the pinion 100 along the trajectory of the rack 110. In the present embodiment, the moving unit 120 may be a flat plate structure.

In the present embodiment, the moving unit 120 may be connected to the pinion 100. In other words, the moving unit 120 is assembled, with a plurality of bolts B1, to the pinion driving portion 105 connected to the pinion 100. Accordingly, the pinion 100, the pinion driving portion 105, and the moving unit 120 are operated together as one body.

The guide module 130 is arranged at both sides of the rack 110, as illustrated in FIG. 1, connected to the moving unit 120, and guides the movement of the moving unit 120 moving with the pinion 100 along the trajectory of the rack 110. The guide modules 130 arranged at both sides of the rack 110 have different positions while having the same structure and function.

The guide module 130 may include a module rail 140, and a running portion 150, a front steering portion 160, and a rear steering portion 170 which are connected to one another at positions on the module rail 140.

The module rail 140 forms a trajectory along which the running portion 150, the front steering portion 160, and the rear steering portion 170 move.

In the present embodiment, the module rail 140 forms the same trajectory as the rack 110. In other words, in the present embodiment, the module rail 140 may form the same trajectory, that is, an S curve, as the rack 110.

The running portion 150 may be arranged between the front steering portion 160 and the rear steering portion 170 and runs along the module rail 140.

The running portion 150 may include a plurality of running wheels 151 guided to run on a side wall of the module rail 140, and a running wheel connection block 152 arranged across the module rail 140 and connected to the running wheels 151.

The running wheels 151 are provided as a pair, and each of the running wheels 151 is supported on the side wall of the module rail 140 to be capable of moving. A bearing is coupled to the running wheels 151 for stable rotation of the running wheels 151.

Unlike the front steering portion 160 and the rear steering portion 170 running by being steered along a curved section of the module rail 140, the running portion 150 moves back and forth without being steered.

The front steering portion 160 is a portion connected to the running portion 150 in front of the running portion 150 of the guide module 130. When the front steering portion 160 and the running portion 150 run linearly and a curved section of the module rail 140 appears ahead, the front steering portion 160 is steered and may lead the running portion 150.

The front steering portion 160 may include a plurality of front steering wheels 161 steered and guided to run on the side wall of the module rail 140 and running when passing the curved section of the module rail 140, and a front steering wheel connection block 162 arranged across the module rail 140 and connected to the front steering wheels 161. The front steering wheels 161 are also provided as a pair, and a bearing is coupled to each of the front steering wheels 161 for smooth rotation.

The rear steering portion 170 is a portion connected to the running portion 150 at the back of the running portion 150. The rear steering portion 170 is located at the opposite side of the front steering portion 160 with respect to the running portion 150. The structures and functions of the front steering portion 160 and the rear steering portion 170 are the same except the positions thereof.

The rear steering portion 170 may include a plurality of rear steering wheels 171 steered and guided to run on the side wall of the module rail 140 when passing the curved section of the module rail 140, and a rear steering wheel connection block 172 arranged across the module rail 140 and connected to the rear steering wheels 171. The rear steering wheels 171 are also provided as a pair, and a bearing is coupled to each of the rear steering wheels 171 for smooth rotation.

In the present embodiment, the guide module 130 may include a front relative rotation connection portion 165 and a rear relative rotation connection portion 175 as devices for connecting the running portion 150 with the front steering portion 160, and the running portion 150 with the rear steering portion 170, to rotate relative to each other.

The front relative rotation connection portion 165 connects the running portion 150 with the front steering portion 160 to be capable of rotating relative to each other, and the rear relative rotation connection portion 175 connects the running portion 150 with the rear steering portion 170 to be capable of rotating relative to each other. In other words, the front relative rotation connection portion 165 enables the front steering portion 160 to rotate while the running portion 150 is in a position fixed state, and the rear relative rotation connection portion 175 enables the rear steering portion 170 to rotate while the running portion 150 is in a position fixed state.

One end portion of the front relative rotation connection portion 165 is arranged on the module rail 140 between the front steering wheels 161, and the other end portion thereof may include a front link member 166 placed in a first side recess portion 152a of the running wheel connection block 152, a first steering bearing 167 integrally coupled to the front steering wheel connection block 162 and the front link member 166 in an area of one end portion of the front link member 166, and a second steering bearing 168 coupled o the other end portion of the front link member 166.

Since the first steering bearing 167 and the second steering bearing 168 are connected to both end portions of the front link member 166 that is arranged between the running portion 150 and the front steering portion 160, even when the running portion 150 is in a position fixed state, the front steering portion 160 may rotate. Accordingly, when the front steering portion 160 and the running portion 150 run linearly, and the curved section of the module rail 140 appears ahead, the front steering portion 160 is steered and may lead the running portion 150.

One end portion of the rear relative rotation connection portion 175 is arranged on the module rail 140 between the rear steering wheels 171, and the other end thereof may include a rear link member 176 placed in a second side recess portion 152b of the running wheel connection block 152, a third steering bearing 177 integrally coupled to the rear steering wheel connection block 172 and the rear link member 176 in an area of one end portion of the rear link member 176, and a fourth steering bearing 178 coupled to the other end portion of the rear link member 176.

Since the third steering bearing 177 and the fourth steering bearing 178 are connected to both end portions of the rear link member 176 that is arranged between the running portion 150 and the rear steering portion 170, the rear steering portion 170 may relatively rotate. Accordingly, as illustrate din FIG. 9, when the running portion 150 enters the linear section of the module rail 140, the rear steering portion 170 may follow in a rotate state.

According to the present embodiment, the guide module 130 may be provided with a supporting block 180. The supporting block 180 is coupled to the moving unit 120 and the running wheel connection block 152 between the moving unit 120 and the running wheel connection block 152, and supports the moving unit 120.

As illustrated in FIG. 6, in the present embodiment, the supporting block 180 is coupled to the running wheel connection block 152 of the running portion 150 by using a plurality of bolts B2. A plurality of bearing holes 181 and 182 where the second steering bearing 168 of the front link member 166 and the fourth steering bearing 178 of the rear link member 176 are respectively seated are formed in the supporting block 180.

As in the present embodiment, due to the structure in which the supporting block 180 is coupled to the running wheel connection block 152 of the running portion 150, the running portion 150, the front steering portion 160, and the rear steering portion 170 are connected to one another by the front link member 166 and the rear link member 176, and the moving unit 120 is coupled to the supporting block 180, these elements may be driven as one body.

As illustrated in FIGS. 5 and 6, a plurality of dowel pins 184 are coupled to the supporting block 180. In other words, one end portion of each of the dowel pins 184 is coupled to a dowel pin hole 183 of the supporting block 180 across a lengthwise direction of the module rail 140, and the other end portion thereof is connected to the moving unit 120 by passing through the supporting block 180.

In the above structure, as illustrated in FIG. 13, the pinion 100 may be arranged on a virtual connection line connecting the dowel pins 184.

As in the present embodiment, since the pinion 100, which is arranged on the virtual connection line connecting the dowel pins 184, is provided on the rack 110, and connected at this position to the guide module 130 and the moving unit 120, a more stable guide operation may be obtained. The pinion 100 may be provided on the rack 110 with respect to the assembly position guide piece 106.

As described above, when the pinion 100 is coupled to the rack 110, the guide module 130 is arranged at both sides of the rack 110, as the moving unit 120 is coupled to the guide module 130 and the pinion 100, during the rotation of the pinion 100, the moving unit 120 may move along the trajectory of the rack 110. In this state, due to the guide module 130, stable movement of the moving unit 120 may be obtained.

In particular, while action/reaction by a pressure angle during driving may be withstood by the running wheels 151 that are fixedly located, vertical support of load of the moving unit 120 or an object placed on the moving unit 120, or an external force, may be provided by all wheels 151, 161, and 171, and support of moment may be provided by the front and rear steering wheels 161 and 171, as the front and rear steering wheels 161 and 171 are free without restrictions to a rotation direction, the front and rear steering wheels 161 and 171 may perform guidance in a rotation direction with respect to a certain curvature.

According to the present embodiment having the above-described structure and operation, when the moving unit 120 mounted on the pinion 100 moves along the trajectory of the rack 110, the movement of the moving unit 120 may be guided, and also deterioration of durability due to an overload applied to the device may be prevented.

FIGS. 14 to 17 are plan views of structures of modified examples of the driving device.

Referring to FIG. 1 and FIGS. 14 to 17 together, the arrangement method of the guide module 130 may vary according to the type of the racks 110, 210a, and 210b or the shape or size of the moving units 120, 220a, and 220b.

In the above-describe case of FIG. 1, in which the pinion 100 circumscribes the rack 110, since the size of the moving unit 120 is relatively large, the guide module 130 is provided at both sides of the rack 110.

Figure 14:
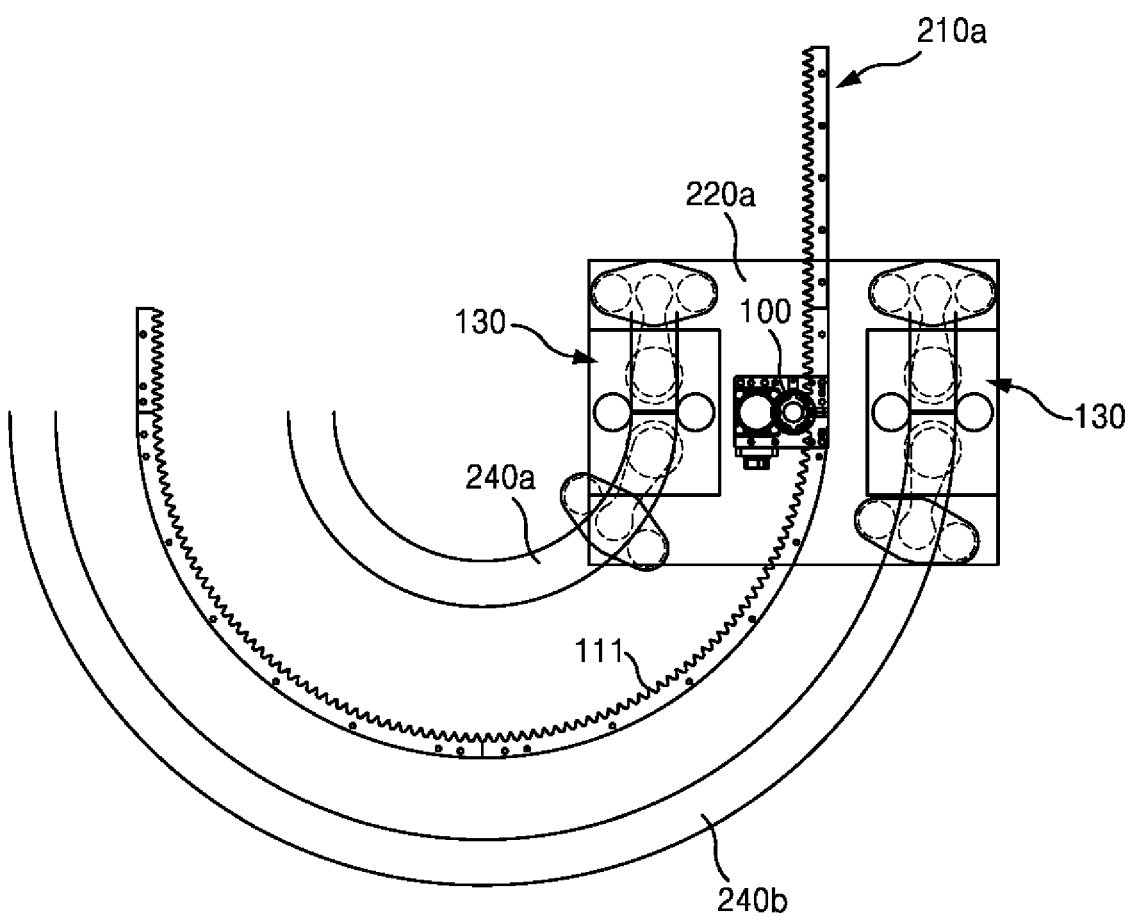
FIGS. 14 to 17 are plan views of structures of modified examples of the driving device.

In contrast, in the embodiment of FIG. 14, in which the pinion 100 inscribes the rack 210a, the guide module 130 is provided at both sides of the rack 210a for stable guide of a moving unit 220a having a relatively large size.

Figure 15:
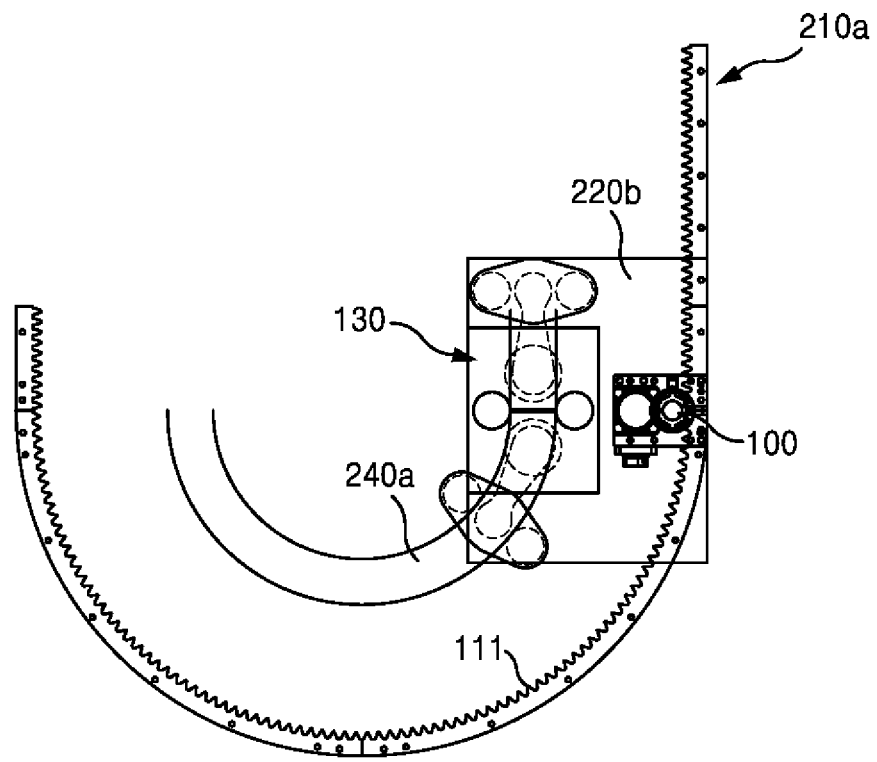

In the embodiment of FIG. 15, in which the pinion 100 inscribes the rack 210a, as illustrated in FIG. 14, but a moving unit 220b having a relatively small size is employed, the guide module 130 is provided only at the inner side of the rack 210a.

Figure 16:
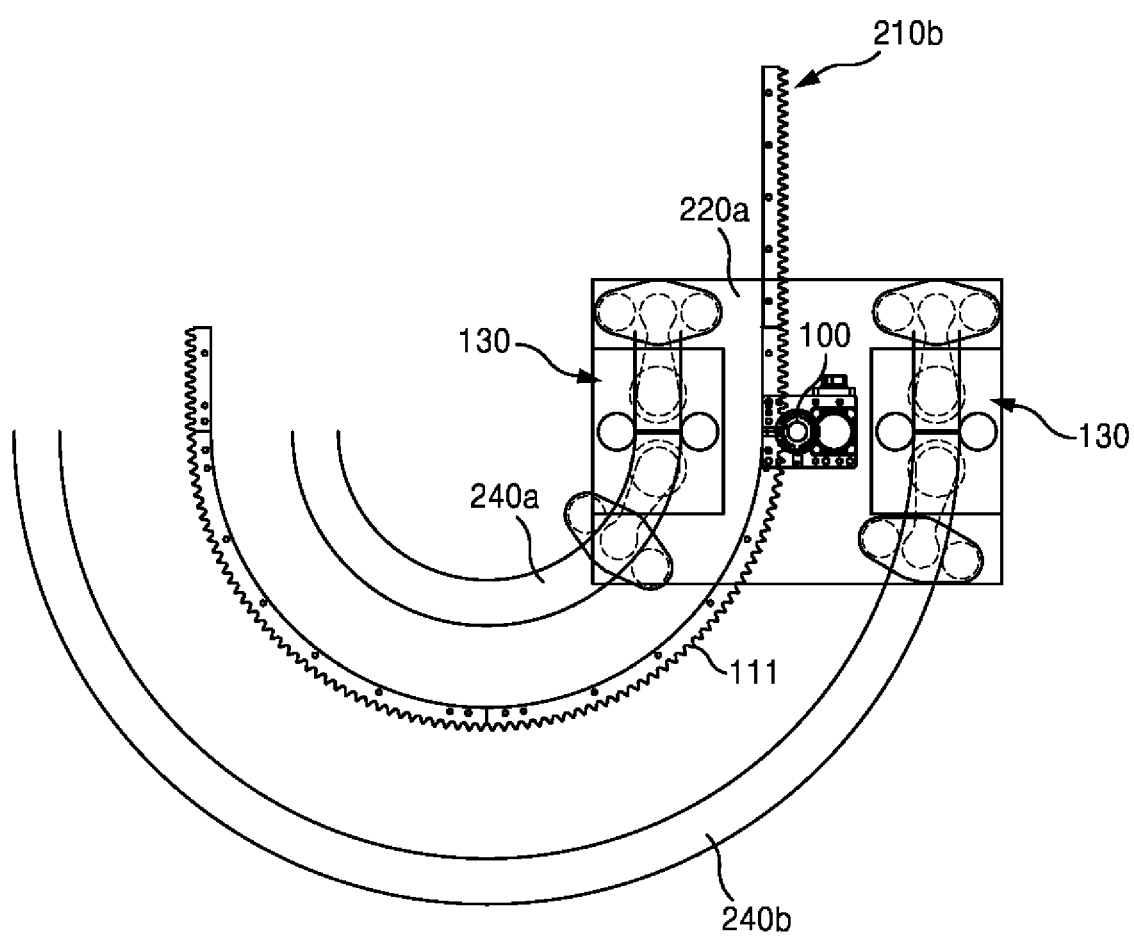

In the embodiment of FIG. 16, in which the pinion 100 circumscribes the rack 210b, for stable guide of the moving unit 220a having a relatively large size, the guide module 130 is provided at both sides of the rack 210b.

Figure 17:
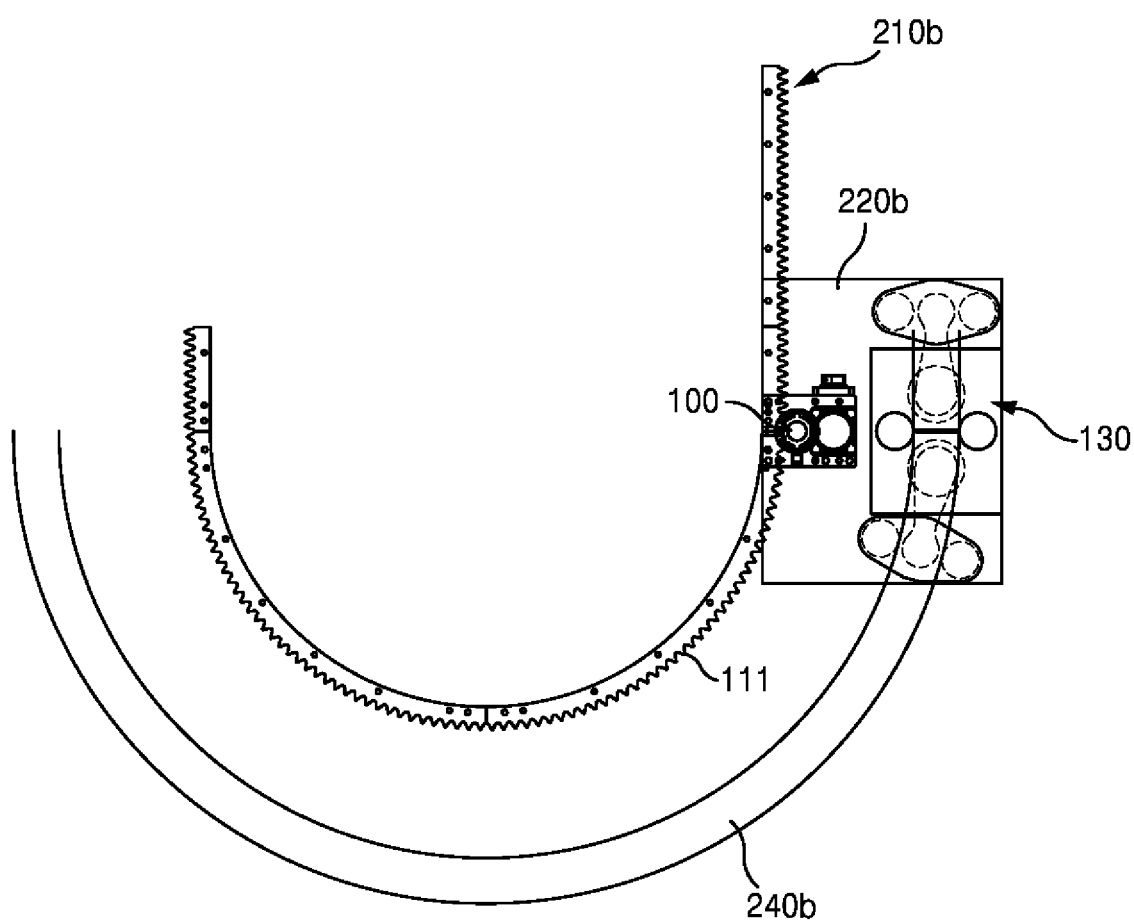

In the embodiment of FIG. 17, in which the pinion 100 circumscribes the rack 210b, as illustrated in FIG. 16, but the moving unit 220b having a relatively small size is employed, the guide module 130 is provided only at the outer side of the rack 210a.

When the driving devices configured as above are employed, when the moving units 220a and 220b mounted on the pinion 100 respectively move along trajectories of the racks 210a and 210b, the movements of the moving units 220a and 220b may be guided, and also the deterioration of durability due to an overload applied to the device may be prevented.

Figure 18:
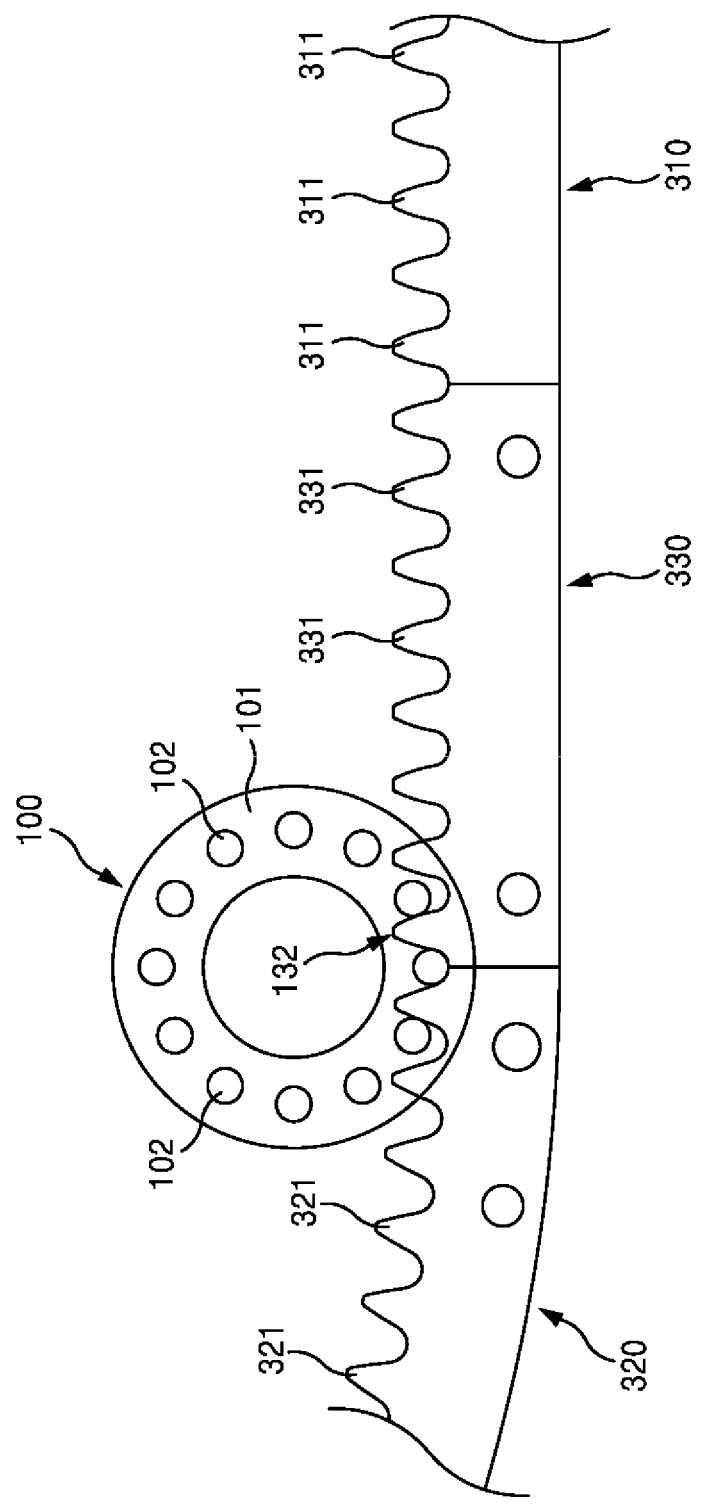
FIG. 18 illustrates a modified example of a rack that is applied to a driving device according to another embodiment of the present inventive concept.
Figure 19:
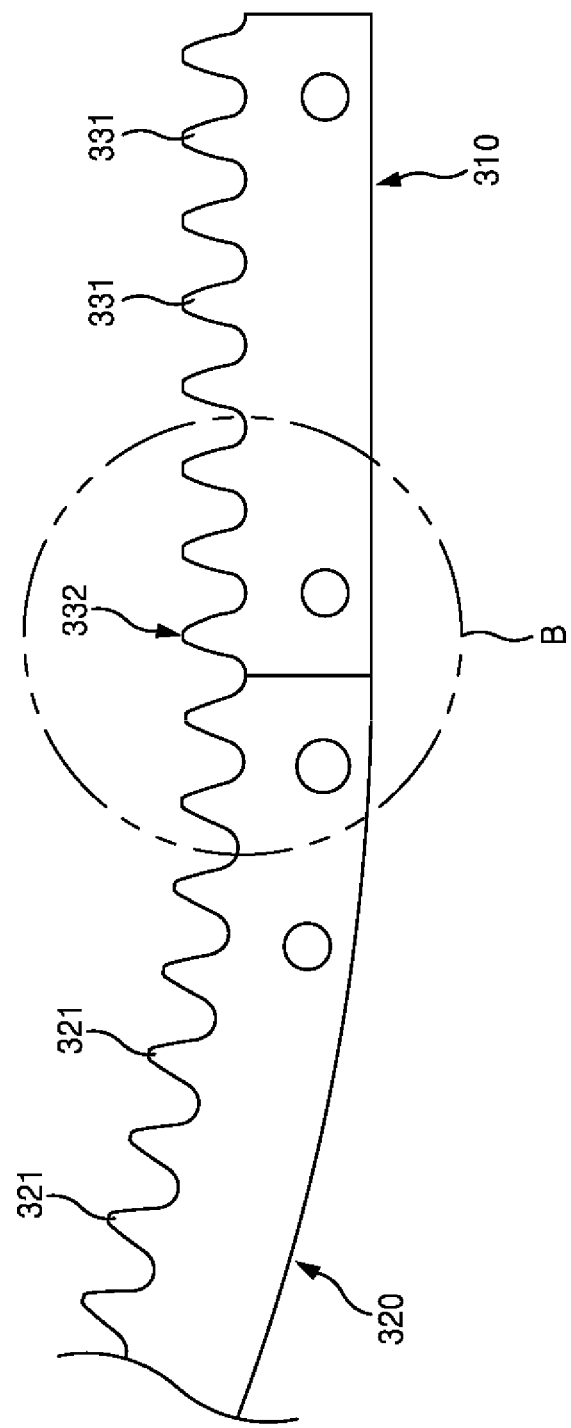
FIG. 19 is an enlarged view of a major portion of FIG. 18.
Figure 20:
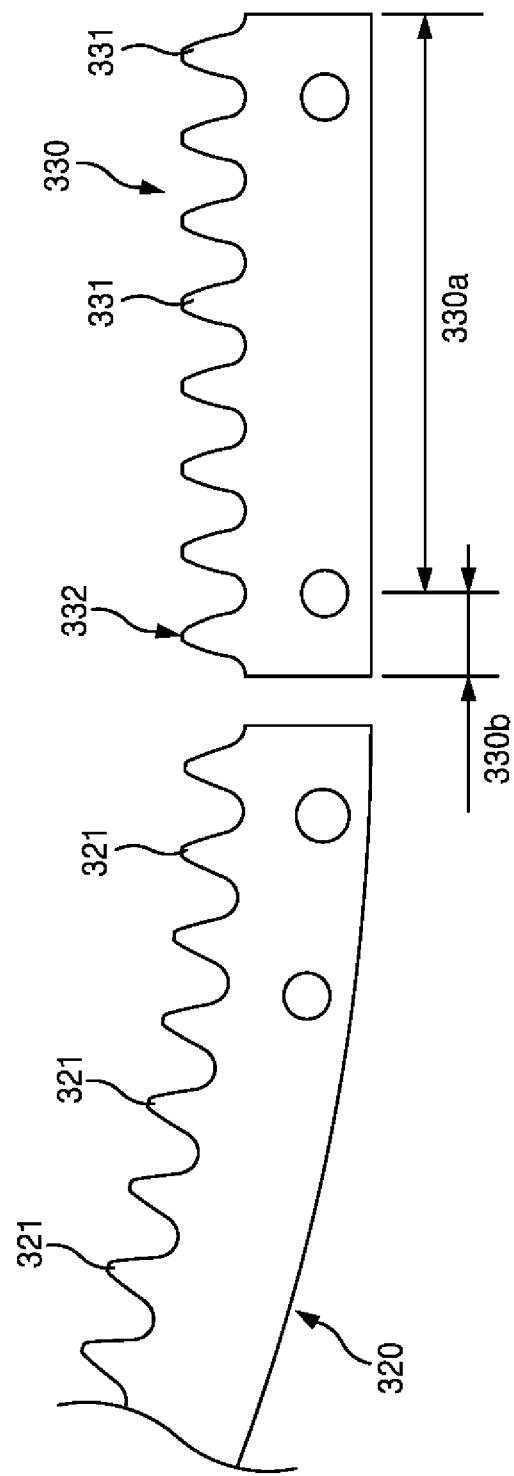
FIG. 20 illustrates a separate state of FIG. 19.
Figure 21:
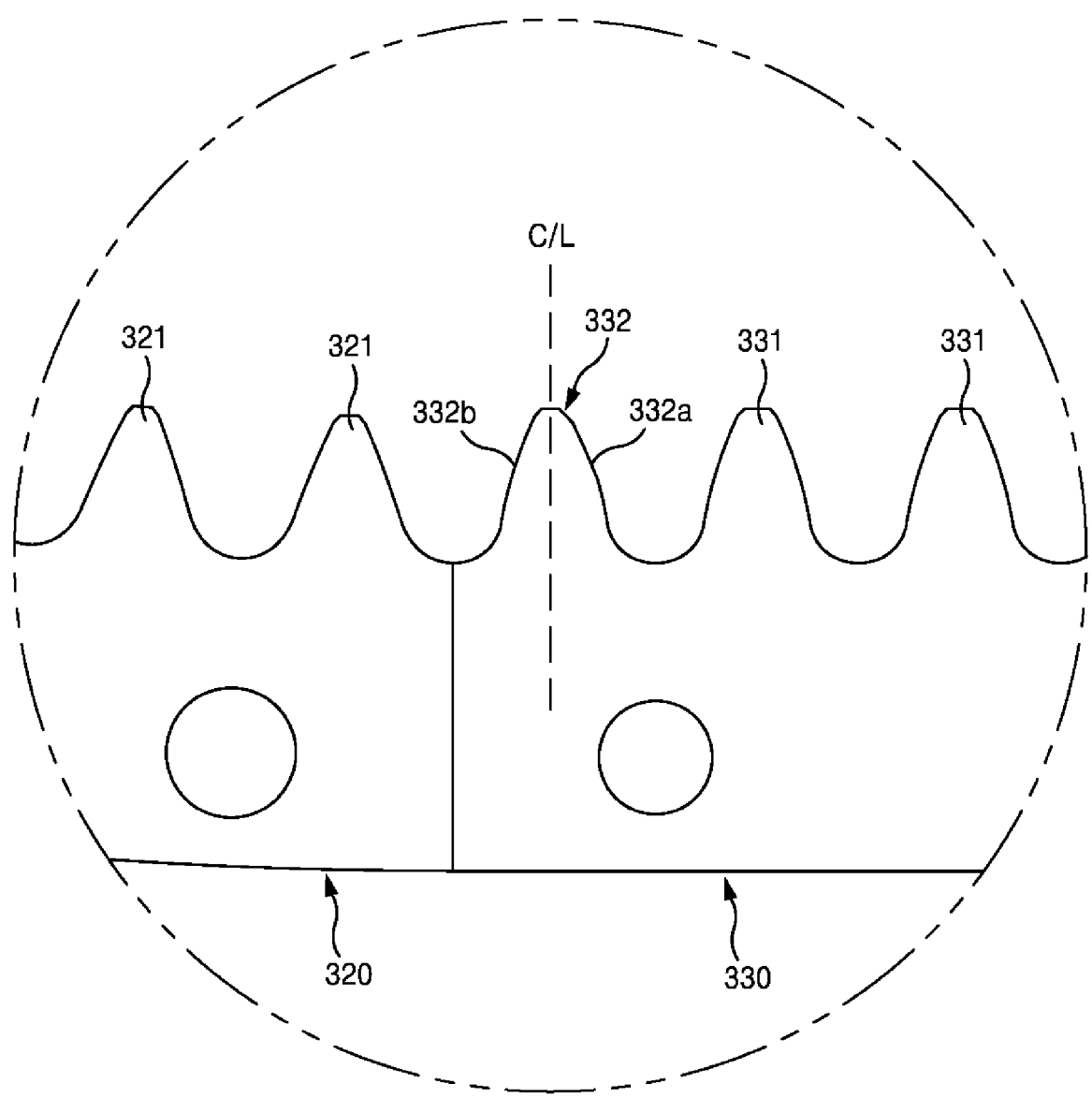
FIG. 21 is an enlarged view of an area B of FIG. 18.

FIG. 18 illustrates a modified example of a rack that is applied to a driving device according to another embodiment of the present inventive concept. FIG. 19 is an enlarged view of a major portion of FIG. 18. FIG. 20 illustrates a separate state of FIG. 19. FIG. 21 is an enlarged view of an area B of FIG. 18.

Referring to these drawings, racks 310, 320, and 330 applied to the driving device according to the present embodiment may include, unlike the rack 110 of the above-described embodiment (see FIGS. 1 and 10), a linear type rack 310 for a linear motion of the pinion 100, a curved type rack 320 for a curved motion of the pinion 100, and a linear/curve converting rack 330 for converting the linear motion and the curved motion of the pinion 100. The structure of the pinion 100 is the same as that of the above-described embodiment.

The linear type rack 310, by interaction with the pinion 100, allows the pinion 100 to perform a linear motion, and the curved type rack 320, by interaction with the pinion 100, allows the pinion 100 to perform a curved motion.

In the present embodiment, the linear/curve converting rack 330 is connected to at each of both end portions of the curved type rack 320 having a roughly semicircular shape, and then the linear type rack 310 is connected to each linear/curve converting rack 330.

The linear type rack 310 and the curved type rack 320 are connected to each other in order for the pinion 100 to continuously perform a linear motion and a curved motion without interruption. To this end, the linear/curve converting rack 330 is employed.

The linear/curve converting rack 330 is connected to the linear type rack 310 and the curved type rack 320 between the linear type rack 310 and the curved type rack 320, and converts the linear motion and the curved motion of the pinion 100.

In this state, when tooth profile curves of the linear type rack 310 and the curved type rack 320 are cycloid curves or trochoid curves, it may be difficult to simply connect the linear type rack 310 with the curved type rack 320 due to a structural limit by a difference of curvature. For reference, a cycloid curve denotes a trajectory of a point when the point is marked on the circumference of a circle and the circle rolls on a line. In contrast, a trochoid curve denotes a trajectory of a point that is fixed inside or outside a circle, not the point on the circumference thereof.

When teeth 311 and 321 of the linear type rack 310 and the curved type rack 320 are formed by using the cycloid curve and the trochoid curve, it is difficult to connect the linear type rack 310 with the curved type rack 320 due to the structural limit by the difference of curvature of the teeth 311 and 321, and thus this case has not been applied so far.

However, in the case of the present embodiment, as the linear type rack 310 and the curved type rack 320 are connected by using the linear/curve converting rack 330, even when the tooth profile curves of the linear type rack 310 and the curved type rack 320 are cycloid curves or trochoid curves, the linear type rack 310 and the curved type rack 320 are flexibly and easily connected with each other without interruption as shown in FIG. 1. The scope of right of the present disclosure is not limited thereto. In other words, the tooth profile curves of the linear type rack 310 and the curved type rack 320 may be involute curves.

The linear/curve converting rack 330 applied to the present embodiment may include a linear portion 330a having a linear type tooth 331 connected to the linear type rack 310, and a linear/curved converting portion 330b having a linear/curve converting tooth 332, in which one side of the linear/curve converting tooth 332 is connected to the linear type tooth 331 of the linear portion 330a and the other side of the linear/curve converting tooth 332 is connected to the curved type rack 320.

The linear portion 330a and the linear/curved converting portion 330b, which are of a separate type in terms of a tooth profile only, may be coupled to each other. However, considering action and reaction needed for power transfer, the linear portion 330a and the linear/curved converting portion 330b may be integrally manufactured for use.

The linear type tooth 331 provided on the linear portion 330a has substantially the same tooth profile as that of the teeth 311 of the linear type rack 310. The linear type tooth 331 provided on the linear portion 330a may include a plurality of, for example, at least three or four linear type teeth.

The linear/curve converting tooth 332 provided on the linear/curved converting portion 330b may include one or two linear/curve converting teeth. Also, it may be considered that the linear/curve converting tooth 332 includes three or more linear/curve converting teeth, but in this case, the pinion 100 that is expensive becomes too large and it may not be practical. Thus, the linear/curve converting tooth 332 may be such that one or two linear/curve converting teeth provided at an end portion of the linear/curve converting rack 330.

The linear/curve converting tooth 332, which is connected to the curved type rack 320, converts the linear motion of the pinion 100 to the curved motion or the curved motion of the pinion 100 to the linear motion.

As illustrated in FIG. 21, tooth profiles 332a and 332b of both side surfaces of the linear/curve converting tooth 332 may be asymmetrical with respect to a center line C/L. In other words, in the linear/curve converting tooth 332, curvatures of the tooth profiles 332a and 332b at both side surfaces are different from each other with respect to the center line C/L.

As in the present embodiment, since the tooth profiles 332a and 332b of both side surfaces of the linear/curve converting tooth 332 are asymmetrical, even when the tooth profile curves of the linear type rack 310 and the curved type rack 320 are cycloid curves or trochoid curves, the linear type rack 310 and the curved type rack 320 may be easily connected to each other as illustrated in FIG. 1.

In addition, as illustrated in FIG. 18, when the power transfer pins 102 of the pinion 100 rotate and move along the teeth 311 and 321 of the linear type rack 310 and the curved type rack 320, the power transfer pins 102 may stably move without deviation from the trajectory.

In this state, the curvature of the first tooth profile 332a formed on one side surface of the linear/curve converting tooth 332 may match the tooth profile curvature of the teeth 321 formed on the curved type rack 320. The curvature of the second tooth profile 332b formed on the other side surface of the linear/curve converting tooth 332 may match the tooth profile curvature of the teeth 311 formed on the linear type rack 310.

For reference, as the curvature of the first tooth profile 332a varies according to the designed curved motion type, that is, a reduction ratio, a tooth contact ratio, or a shifted amount, and the curvature of the second tooth profile 332b varies according to the designed linear motion type, that is, a tooth contact ratio, a transfer amount per rotation, or a shifted amount, a combination thereof may be unlimited.

The effect of the present inventive concept may be provided by employing the racks 310, 320, and 330 configured as above.

While this inventive concept has been particularly shown and described with reference to preferred embodiments thereof, it will be understood by those of ordinary skill in the art that various changes in form and details may be made therein without departing from the spirit and scope of the inventive concept as defined by the appended claims. Therefore, the scope of the inventive concept is defined not by the detailed description of the inventive concept but by the appended claims, and all differences within the scope will be construed as being included in the present inventive concept.

INDUSTRIAL APPLICABILITY

The present inventive concept may be used for industrial equipment for carrying goods, or for various logistics transfer equipment.

The invention claimed is:

1. A driving device comprising:
a moving unit mounted on a pinion interacting with a rack and moving with the pinion along a trajectory of the rack; and
a guide module arranged at at least any one side of the rack, connected to the moving unit, and guiding a movement of the moving unit that moves with the pinion along the trajectory of the rack, wherein the guide module comprises:
a module rail forming the same trajectory as the rack at one side of the rack; and
a running portion comprising a plurality of running wheels guided to run on a side wall of the module rail, and a running wheel connection block arranged across the module rail and connected to the plurality of running wheels,
wherein the guide module further comprises a front steering portion connected to the running portion in front of the running portion, and
the front steering portion comprises:
a plurality of front steering wheels steered and guided to run on the side wall of the module rail when passing a curved section of the module rail; and
a front steering wheel connection block arranged across the module rail and connected to the plurality of front steering wheels,
wherein the guide module further comprises a rear steering portion symmetrically arranged to the front steering portion and connected to the running portion at the back of the running portion, and
the rear steering portion comprises:
a plurality of rear steering wheels steered and guided to run on the side wall of the module rail when passing the curved section of the module rail; and
a rear steering wheel connection block arranged across the module rail and connected to the plurality of rear steering wheels.

2. The driving device of claim 1, wherein the guide module further comprises:
a front relative rotation connection portion connecting the running portion with the front steering portion to rotate relative to each other; and
a rear relative rotation connection portion connecting the running portion with the rear steering portion to rotate relative to each other.

3. The driving device of claim 2, wherein the front relative rotation connection portion comprises:
a front link member having one end portion arranged on the module rail between the plurality of front steering wheels and the other end portion placed in a first side recess portion of the running wheel connection block;
a first steering bearing integrally coupled to the front steering wheel connection block and the front link member in an area of one end portion of the front link member; and
a second steering bearing coupled to the other end portion of the front link member.

4. The driving device of claim 3, wherein the rear relative rotation connection portion comprises:
a rear link member having one end portion arranged on the module rail between the plurality of rear steering wheels and the other end portion placed in a second side recess portion of the running wheel connection block;
a third steering bearing integrally coupled to the rear steering wheel connection block and the rear link member in an area of one end portion of the rear link member; and
a fourth steering bearing coupled to the other end portion of the rear link member.

5. The driving device of claim 4, wherein the guide module further comprises a supporting block supporting the moving unit, the supporting block being coupled to the moving unit and the running wheel connection block between the moving unit and the running wheel connection block.

6. The driving device of claim 5, wherein a plurality of bearing holes where the second steering bearing and the fourth steering bearing are respectively seated are formed in the supporting block.

7. The driving device of claim 5, wherein the guide module further comprises a plurality of dowel pins, each having one end portion coupled to the supporting block across a lengthwise direction of the module rail and the other end portion connected to the moving unit by passing through the supporting block.

8. The driving device of claim 7, wherein the pinion is arranged on a virtual connection line connecting the plurality of dowel pins.

9. The driving device of claim 1, wherein the rack comprises:
a linear type rack allowing the pinion to perform a linear motion;
a curved type rack allowing the pinion to perform a curved motion by interaction with the pinion; and
a linear/curve converting rack connected to the linear type rack and the curved type rack between the linear type rack and the curved type rack, and converting the linear motion and the curved motion of the pinion.

10. The driving device of claim 9, wherein the linear/curve converting rack comprises:
a linear portion having a linear type tooth connected to the linear type rack; and
a linear/curved converting portion having a linear/curve converting tooth, wherein one side of the linear/curve converting tooth is connected to the linear portion and the other side of the linear/curve converting tooth is connected to the curved type rack.

11. The driving device of claim 10, wherein the linear portion and the linear/curved converting portion are integrally formed,
the linear type tooth comprises a plurality of linear type teeth on the linear portion, and the linear/curve converting tooth comprises one or two linear/curve converting teeth on the linear/curved converting portion.

12. The driving device of claim 10, wherein tooth profiles of both sides surfaces of the linear/curve converting tooth are asymmetrical with respect to a center line,
a curvature of a first tooth profile of one side surface of the linear/curve converting tooth matches tooth profile curvatures of teeth formed on the curved type rack, and
a curvature of a second tooth profile of the other side surface of the linear/curve converting tooth matches tooth profile curvatures of teeth formed on the linear type rack.

13. The driving device of claim 1, wherein the pinion has an arrangement structure of a circular shape and comprises a plurality of power transfer pins rotating mutually corresponding to a tooth profile of the rack, and
a pinion driving portion that drives the pinion for rotation of the pinion is connected to the pinion.

14. A guide module which is arranged at at least any one side of a rack that interacts with a pinion, connected to a moving unit that moves with the pinion along a trajectory of the rack, and guides a movement of the moving unit, the guide module comprising:
a module rail forming the same trajectory as the rack on one side of the rack; and
a running portion comprising a plurality of running wheels guided to run on a side wall of the module rail, and a running wheel connection block arranged across the module rail and connected to the plurality of running wheels,
further comprising a front steering portion connected to the running portion in front of the running portion,
wherein the front steering portion comprises:
a plurality of front steering wheels steered and guided to run on the side wall of the module rail when passing a curved section of the module rail; and
a front steering wheel connection block arranged across the module rail and connected to the plurality of front steering wheels,
further comprising a rear steering portion arranged symmetrically to the front steering portion and connected to the running portion at the back of the running portion,
wherein the rear steering portion comprises:
a plurality of rear steering wheels steered and guided to run on the side wall of the module rail when passing a curved section of the module rail; and
a rear steering wheel connection block arranged across the module rail and connected to the plurality of rear steering wheels.

15. The guide module of claim 14, further comprising:
a front relative rotation connection portion connecting the running portion with the front steering portion to rotate relative to each other; and
a rear relative rotation connection portion connecting the running portion with the rear steering portion to rotate relative to each other.

16. The guide module of claim 15, wherein the front relative rotation connection portion comprises:
a front link member having one end portion arranged on the module rail between the plurality of front steering wheels and the other end portion placed in a first side recess portion of the running wheel connection block;
a first steering bearing integrally coupled to the front steering wheel connection block and the front link member in an area of one end portion of the front link member; and
a second steering bearing coupled to the other end portion of the front link member.

17. The guide module of claim 16, wherein the rear relative rotation connection portion comprises:
a rear link member having one end portion arranged on the module rail between the plurality of rear steering wheels and the other end portion placed in a second side recess portion of the running wheel connection block;
a third steering bearing integrally coupled to the rear steering wheel connection block and the rear link member in an area of one end portion of the rear link member; and
a fourth steering bearing coupled to the other end portion of the rear link member.

18. The guide module of claim 17, further comprising a supporting block supporting the moving unit, the supporting block being coupled to the moving unit and the running wheel connection block between the moving unit and the running wheel connection block,
wherein a plurality of bearing holes where the second steering bearing and the fourth steering bearing are respectively seated are formed in the supporting block.

19. The guide module of claim 18, further comprising a plurality of dowel pins, each having one end portion coupled to the supporting block across a lengthwise direction of the module rail and the other end portion connected to the moving unit by passing through the supporting block.

20. The guide module of claim 19, wherein the pinion is arranged on a virtual connection line connecting the plurality of dowel pins.

* * * * *